US006972595B2

(12) United States Patent
Reithofer

(10) Patent No.: US 6,972,595 B2
(45) Date of Patent: Dec. 6, 2005

(54) ELECTRICAL CIRCUIT

(75) Inventor: Axel Reithofer, Graz (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/125,084

(22) Filed: Apr. 18, 2002

(65) Prior Publication Data

US 2002/0158664 A1 Oct. 31, 2002

(30) Foreign Application Priority Data

Apr. 18, 2001 (DE) ................................. 101 18 863

(51) Int. Cl.[7] .................................... H03K 19/0175
(52) U.S. Cl. .......................................... 326/82; 326/83
(58) Field of Search ............................ 326/82–90, 112, 326/119

(56) References Cited

U.S. PATENT DOCUMENTS

| | | | | |
|---|---|---|---|---|
| 4,772,843 A | * | 9/1988 | Asaka et al. ............... 368/113 |
| 5,254,883 A | * | 10/1993 | Horowitz et al. ............. 326/30 |
| 6,028,456 A | * | 2/2000 | Littlefield ..................... 327/74 |
| 6,031,403 A | | 2/2000 | Gersbach | |
| 6,118,304 A | * | 9/2000 | Potter et al. .................. 326/93 |
| 6,459,304 B1 | * | 10/2002 | Naffziger et al. ........... 326/121 |
| 2002/0063576 A1 | * | 5/2002 | Kim et al. ..................... 326/30 |

FOREIGN PATENT DOCUMENTS

| | | |
|---|---|---|
| DE | 44 25 624 A1 | 1/1996 |
| EP | 0 583 203 B1 | 2/1994 |
| EP | 0 771 072 B1 | 5/1997 |
| EP | 0 973 261 A2 | 1/2000 |
| JP | 03 203 409 A | 9/1991 |
| JP | 03 207 116 A | 9/1991 |

* cited by examiner

Primary Examiner—Don Le
(74) Attorney, Agent, or Firm—Laurence A. Greenberg; Werner H. Stemer; Ralph E. Locher

(57) ABSTRACT

An electrical circuit assembly includes a node and an electrical circuit. The circuit draws a node point to a specific potential when and for as long as the node point is not drawn in any other way to a different potential. The electrical circuit is distinguished by the fact that the electrical circuit operates as a function of the potential at the node point. In other words, the potential to which the node point is drawn by the electrical circuit can be varied by a weak signal, but not also just by electromagnetic interference.

19 Claims, 2 Drawing Sheets

ELECTRICAL CIRCUIT

BACKGROUND OF THE INVENTION

Field of the Invention

The present invention relates to an electrical circuit that draws a node point to a specific potential when and for as long as the node point is not drawn in any other way to a different potential.

Such electrical circuits are required to prevent the node point from floating and/or to prevent the voltage level at the node point from changing as a result of interference signals. This is important, for example, when the level of the node point governs how an electrical circuit or electrical component that is connected to it will operate.

Such an electrical circuit is required, for example, for an integrated circuit that operates as a function of the level of a voltage that is applied from the outside to a specific input connection (Pin) (for example, a circuit that operates in a first operating mode when a low voltage level is applied to the pin, and operates in a second operating mode when a high voltage level is applied to the pin). The electrical circuit is intended to prevent the integrated circuit from operating in a random manner when no control signal is applied to the pin.

Electrical circuits such as these include so-called pull-up circuits and pull-down circuits, and are, in general, formed by a pull-up or pull-down resistor, or by a pull-up or pull-down current source, respectively. The basic construction of such electrical circuits is shown in FIGS. 3 and 4.

FIG. 3 shows an integrated circuit IC having a large number of input and/or output connections IO1, IO2, . . . IOn, with the operation of the integrated circuit depending on the level of a voltage applied to an input connection IOc. An inverter I and a resistor R are connected upstream of the input connection, with the inverter I inverting the voltage applied to the input connection IOc and passing it on, with the resistor R connecting the input connection IOc to a point that is at a high voltage level (in this case, the resistor R acts as a pull-up resistor), or connecting it to a point that is at a low voltage level (in this case, the resistor R acts as a pull-down resistor).

The resistor R has a resistance such that it draws the input connection to the high level (pull-up resistor) or to the low level (pull-down resistor) when no voltage is applied from the outside to the input connection IOc, and such that it leaves the voltage level at the input connection IOc substantially unchanged when a voltage is applied from the outside to the input connection IOc.

With the configuration shown in FIG. 4, a current source IQ is used instead of the resistor R and acts as a pull-up current source or a pull-down current source, depending on its polarity so that, overall, it achieves the same effect as the resistor R in the configuration shown in FIG. 3.

Pull-up and pull-down circuits such as these, as well as other such circuits, have the problem that it is difficult, or even impossible, to dimension them optimally. If the input connection IOc is drawn strongly to the high or to the low voltage level by a small resistor R or by a powerful current source IQ, then a high power loss must be expected when the opposite voltage level is applied from the outside to the input connection; if the input connection IOc is drawn by a large resistor R or a weak current source IQ weakly to the high voltage level or to the low voltage level, then it is possible for interference (for example electromagnetic radiation) to lead to an undesired change to the voltage level at the input connection IOc.

SUMMARY OF THE INVENTION

It is accordingly an object of the invention to provide an electrical circuit that overcomes the hereinafore-mentioned disadvantages of the heretofore-known devices of this general type and that varies the potential to which the node point is drawn by the electrical circuit by a weak signal, but not also just by electromagnetic interference.

With the foregoing and other objects in view, there is provided, in accordance with the invention, an electrical circuit assembly, including a node supplying a potential and an electrical circuit drawing, dependent upon the potential at the node, the node to a given potential when and for as long as the node is not drawn in any other way to a different potential.

The electrical circuit according to the invention is distinguished in that it operates as a function of the potential at the node point. Thus, the claimed electrical circuit is able to draw the potential at the node point:

weakly to the specific potential when and for as long as the node point is drawn to a different potential by an external signal; and strongly to the specific potential when and for as long as the node point is not drawn to a different potential by an external signal. As such, the potential to which the node point is drawn by the electrical circuit can be varied by a weak signal, but not also just by electromagnetic interference.

In accordance with another feature of the invention, the electrical circuit is a pull-up circuit drawing the node to a high voltage level when and for as long as the node is not drawn in another way to a lower voltage level.

In accordance with a further feature of the invention, the electrical circuit is a pull-down circuit drawing the node to a low voltage level when and for as long as the node is not drawn in another way to a higher voltage level.

In accordance with an added feature of the invention, the electrical circuit is part of an integrated circuit, and the node is connected to an input connection of the integrated circuit.

In accordance with an additional feature of the invention, there is provided a further electrical circuit connected to the node, the further electrical circuit operating dependent upon the potential at the node.

In accordance with yet another feature of the invention, the electrical circuit has a component connecting the node to the given potential to which the node is to be brought by the electrical circuit.

In accordance with yet a further feature of the invention, the electrical circuit has a second component connecting the node to the given potential to which the node is to be brought by the electrical circuit.

In accordance with yet an added feature of the invention, there is provided a switching element, and the second component is connected through the switching element to the node. The switching element is opened when the potential at the node is below a threshold value and the switching element is closed when the potential at the node is above the threshold value or above a second threshold value.

In accordance with yet an additional feature of the invention, there is provided a comparator having an output providing an output signal controlling the switching element, the comparator comparing the potential at the node with the threshold voltage.

In accordance with again another feature of the invention, the component and/or the second component is a resistor.

In accordance with again a further feature of the invention, the component and/or the second component is a current source.

In accordance with again an added feature of the invention, the component has a control input and, by driving the component through the control input, the component selects how strongly the node is drawn to the given potential.

In accordance with again an additional feature of the invention, there is provided a control device having an output providing an output signal, and wherein the component is a transistor having a drain connected to the node, a source receiving a voltage corresponding approximately to the given potential to which the node is to be brought, and a gate connected to the output of the control device.

In accordance with a concomitant feature of the invention, there is provided a supply voltage having a first pole and a second pole. The supply voltage supplies power to the control device. The control device includes a second transistor having a source, and a drain, a third transistor having a source, a drain, and a gate, and a current source having a first pole and a second pole. The second transistor, the third transistor, and the current source are connected in series. The source of the second transistor is connected to the first pole of the supply voltage. The drain of the second transistor is connected to the source of the third transistor. The gate of the second transistor is connected to the node. The drain of the third transistor is connected to the first pole of the current source, to the gate of the third transistor, and to the gate of the transistor. The gate of the third transistor is connected to the first pole of the current source, to the drain of the third transistor, and to the gate of the transistor. The first pole of the current source is connected to the gate of the transistor. The second pole of the current source is connected to the second pole of the supply voltage.

Other features that are considered as characteristic for the invention are set forth in the appended claims.

Although the invention is illustrated and described herein as embodied in an electrical circuit, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

The pull-up or pull-down circuit that is described in more detail in the following text is a part of an integrated circuit and is used to draw a specific input connection of the integrated circuit:

to a high voltage level when and for as long as no low voltage level is applied from the outside to the relevant input connection; or to a low voltage level when and for as long as no high voltage level is applied from the outside to the relevant input connection. However, it should be mentioned that the described circuit can also be provided outside an integrated circuit, and that the described circuit may also draw any other node points, as input and/or output connections of integrated circuits, to a high or a low voltage level.

Figure 1:
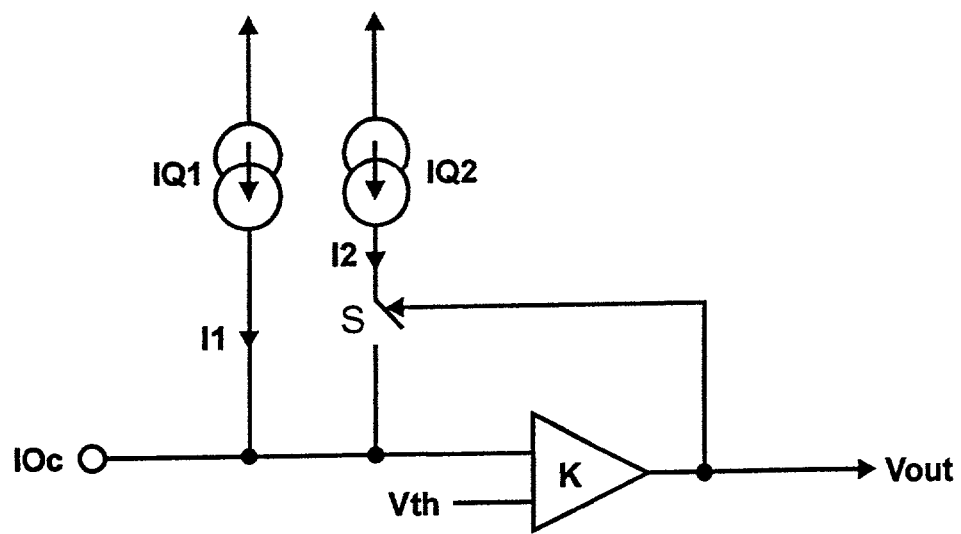
FIG. 1 is a schematic circuit diagram of a pull-up or pull-down circuit according to the invention.

Referring now to the figures of the drawings in detail and first, particularly to FIG. 1 thereof, there is shown a circuit used to draw an input connection IOc of the integrated circuit containing the circuit to a high or a low voltage level when and for as long as no low or no high voltage level is applied from the outside to the relevant input connection. The illustrated circuit includes:

a first current source IQ1 that is connected to the input connection IOc;

a second current source IQ2 that is connected through a switch S to the input connection IOc, with the switch S being opened when a signal controlling it is at a low voltage level, and with the switch being closed when the signal controlling it is at a high voltage level (or vice-versa); and a comparator K that compares the voltage level at the input connection IOc and supplied to a first input connection of the comparator with a threshold voltage Vth that is supplied to a second input connection of the comparator, and whose output signal, which represents the comparison result, is used to control the switch S and is passed on to the components of the integrated circuit that operate as a function of the voltage level at the input connection IOc.

The following text describes the operation of the circuit illustrated in FIG. 1 where the circuit is a pull-up circuit.

The pull-up circuit draws the input connection IOc to a high voltage level when and for as long as no voltage at a low level is applied from the outside to the input connection.

When a low voltage level is applied from the outside to the input connection IOc, the potential that results at the input connection IOc is drawn downward. If the potential that results at the input connection IOc is less than the threshold voltage $V_{th}$, the output signal from the comparator is at a (low) level that opens the switch S, or holds it open. As a result, the voltage level at the input connection IOc can be drawn upward only by the first current source IQ1. The current I1 supplied from the first current source IQ1 is, however, so weak that the voltage level at the input connection IOc is not drawn upward, or is drawn insignificantly upward, and that the power loss caused by the current I1 flow is very small.

When no voltage is applied from the outside to the input connection IOc, the potential at the input connection IOc is drawn upward by the first current source IQ1. When the potential so produced at the input connection IOc exceeds the threshold voltage $V_{th}$, the output signal from the comparator is at a (high) level that closes the switch S. As a result, the voltage at the input connection IOc is additionally drawn upward by the second current source IQ2 as well. The sum of the current I1 supplied from the first current source IQ1 and of the current I2 supplied from the second current source IQ2 is sufficiently large that the voltage level at the input connection IOc is drawn upward sufficiently strongly that interference signals, such as electromagnetic radiation, have no chance to draw the voltage at the input connection IOc to a voltage that represents a low voltage level.

Nevertheless, the pull-up circuit draws the voltage at the input connection IOc:
weakly upward at times at which it is advantageous to draw it weakly upward; and
draws it strongly upward at times at which it is advantageous to draw it strongly upward.

The following text describes a situation where the circuit shown in FIG. 1 is a pull-down circuit.

The pull-down circuit draws the input connection IOc to a low voltage level when and for as long as no voltage at a high level is applied from the outside to the input connection.

When a high voltage level is applied from the outside to the input connection IOc, the potential that is produced in consequence at the input connection IOc is drawn upward. When the potential that is produced in consequence at the input connection IOc is greater than the threshold voltage $V_{th}$, the output signal from the comparator is at a (high) level that opens the switch S, or holds the switch S open. As a result, the voltage level at the input connection IOc can be drawn downward only by the first current source IQ1. However, the current I1 supplied from the first current source IQ1 is so weak that the voltage level at the input connection IOc is not drawn downward, or is drawn downward only to an insignificant extent, and that the power loss caused by the current I1 that flows is very small.

If no voltage is applied from the outside to the input connection IOc, the potential at the input connection IOc is drawn downward by the first current source IQ1. When the potential that is produced in consequence at the input it connection IOc is less than the threshold voltage $V_{th}$, the output signal from the comparator is at a (low) level that closes the switch S, or holds the switch S closed. As a result, the voltage at the input connection IOc is additionally drawn downward by the second current source IQ2 as well. The sum of the current I1 supplied from the first current source IQ1 and of the current I2 supplied from the second current source IQ2 is sufficiently large that the voltage at the input connection IOc is drawn downward sufficiently strongly that interference signals, such as electromagnetic radiation, have no chance to draw the voltage at the input connection IOc to a voltage that represents a high voltage level.

In spite of this, the pull-down circuit draws the voltage at the input connection IOc:
weakly downward at times at which it is advantageous to draw the voltage weakly downward; and
draws it strongly downward at times at which it is advantageous to draw the voltage strongly downward.

MOS transistors or bipolar transistors may be used as the current sources IQ1 and IQ2. Instead of the current sources, resistors may also be used, through which the input connection IOc is connected to a voltage source.

It would also be possible to use only a single pull element instead of two pull elements connected in parallel, and to drive or connect it such that it draws the voltage at the input connection IOc weakly or strongly upward or downward, depending on the voltage.

Furthermore, it is also possible to dispense with the comparator K.

Figure 2:
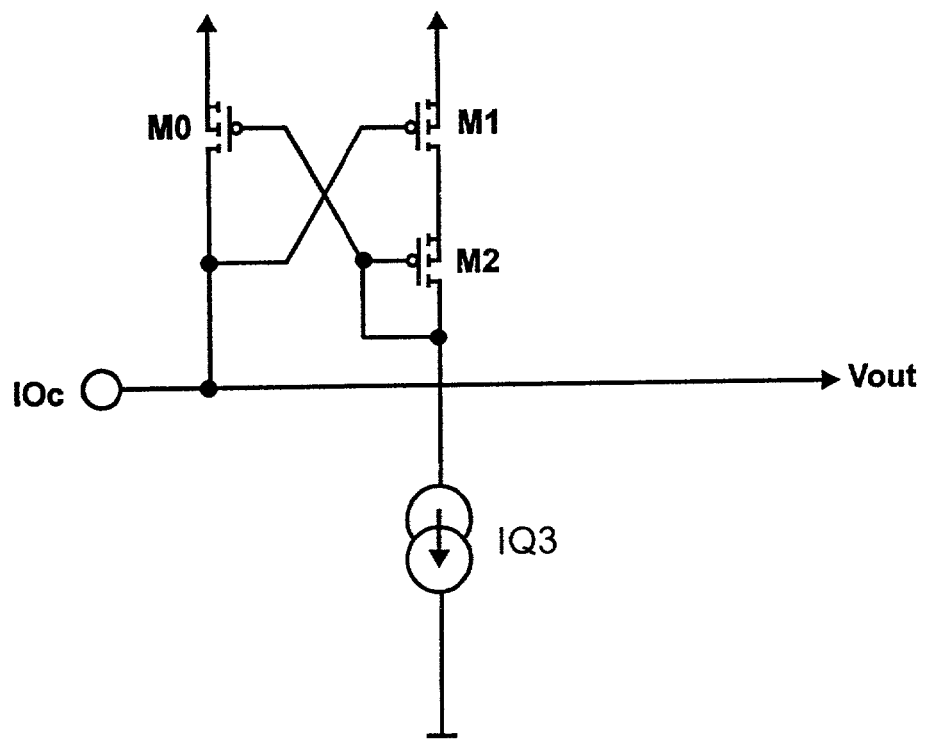
FIG. 2 is a schematic circuit diagram of a simple practical implementation of the circuit of FIG. 1.
Figure 3:
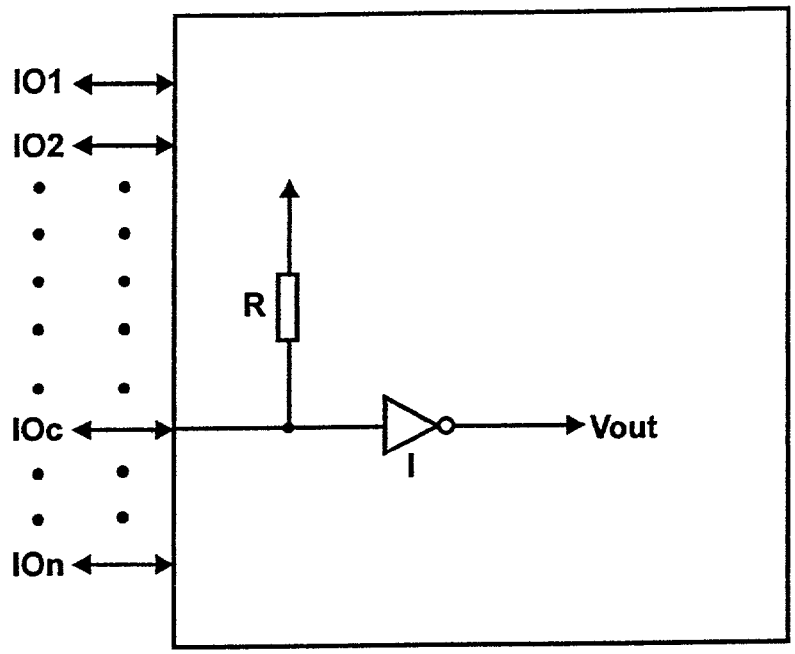
FIG. 3 is a schematic circuit diagram of a prior art pull-up or pull-down circuit.
Figure 4:
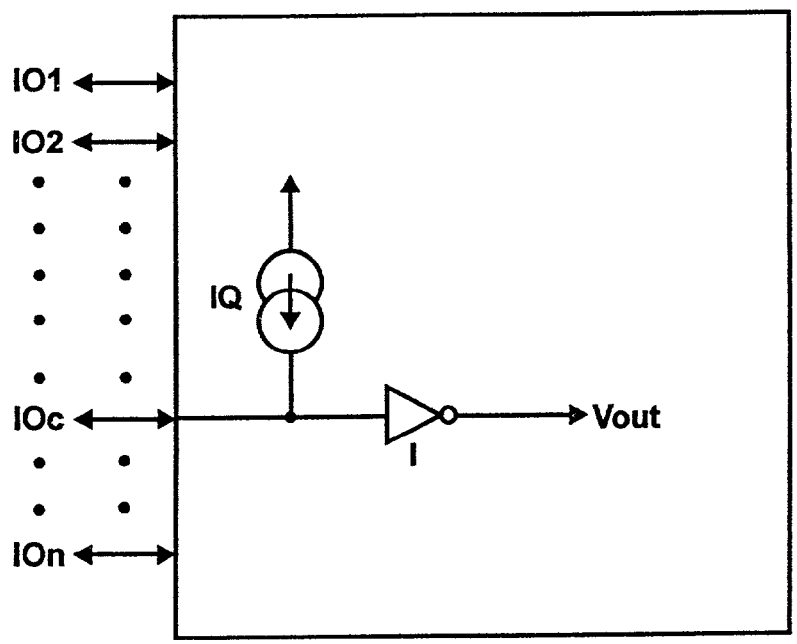
FIG. 4 schematic circuit diagram of a different prior art pull-up or pull-down circuit.

FIG. 2 shows one possible practical implementation of a pull-up circuit that operates as a function of the potential at the input connection IOc. The pull-up circuit shown in FIG. 2 includes a first PMOS transistor MO, whose drain connection is connected to the input connection IOc, whose source connection has a positive voltage applied to it, and whose gate connection is connected to the output signal from a control device that controls the transistor M0. The control device includes a second PMOS transistor M1, a third PMOS transistor M2, and a current source IQ3, with:
the second transistor M1, the third transistor M2, and the current source IQ3 being connected in series;
the source connection of the second transistor M1 being connected to one pole of the supply voltage that supplies power to the control device;
the drain connection of the second transistor M1 being connected to the source connection of the third transistor M2;
the gate connection of the second transistor M1 being connected to the input connection IOc;
the source connection of the third transistor M2 being connected to the drain connection of the second transistor M1;
the drain connection and the gate connection of the third transistor M2 respectively being connected to one pole of the current source IQ3 and to the gate connection of the first transistor MO;
one pole of the current source IQ3 being connected to the gate connection and to the drain connection of the third transistor M2, and being connected to the gate connection of the first transistor MO; and
another pole of the current source IQ3 being connected to ground.

When a low voltage (ground potential) is applied from the outside to the input connection IOc, a large gate-source voltage $U_{GS}$ ($U_{GS}$ corresponds to the supply voltage) is produced across the second transistor M1, and the current source IQ3 draws a small (bias) current. Thus, a drain-source voltage $U_{DS}$ is produced across the second transistor M1 that is negligibly small, because the gate-source voltage $U_{GS}$ of M1 is very large, and M1 is operating in the resistor range. Thus, the transistors M2 and M0 operate as a current mirror, which governs the steady-state current consumption, with the mirror ratio and the steady-state current consumption being freely variable.

When no voltage is applied from the outside to the input connection IOc, the transistor M0 draws the floating potential at the input connection IOc upward. This reduces the gate-source voltage $U_{GS}$ across the transistor M1, and increases the drain-source voltage $U_{DS}$ across the transistor Ml. This, in turn, results in the gate-source voltage $U_{GS}$ of the transistor MO increasing. As a result, the potential at the input connection IOc, and, hence, also the voltage applied to the gate connection of M1, is drawn even further upward. Finally, M1 switches off, and the gate connection of the transistors M0 and M2 is drawn to ground potential by the current source IQ3. In such a state, the transistor MO is operating in the resistor range and allows the maximum possible current to pass that can be produced by the so-called W/L ratio of the transistor M0.

If a current is drawn in such a state from the input connection IOc (by applying a low voltage), the potential at the input connection IOc falls. As a result, the circuit is finally caused to flip or switch over, and the transistors M0 and M2 once again operate as a current mirror, and only relatively small currents flow.

In the case of the pull-up circuit shown in FIG. 2, the steady-state current consumption and the susceptibility to interference can be dimensioned as required and independently of one another by the area ratio of the individual transistors.

The threshold voltage $V_{th}$, as a function of which the circuit shown in FIG. 1 is caused to switch, is, in the circuit shown in FIG. 2, the voltage that causes the cross-coupling circuit contained therein to flip, and can likewise be defined through the area ratio of the transistors.

The circuit must be dimensioned such that the steady-state current is large enough to draw the potential that is produced at the input connection IOc when the input connection IOc is in the floating state above the threshold voltage $V_{th}$. In such a case, it must be remembered that the floating input connection IOc can be connected through parasitic resistances (for example, by a leakage path) to the ground connection of a printed circuit board to which the integrated circuit is fitted. The magnitude of the parasitic resistance is between 50 kΩ and 100 kΩ according to statements from some manufacturers.

An non-illustrated inverter is preferably connected downstream from the circuit illustrated in FIG. 2. Such an inverter is preferably dimensioned to have its switching threshold below Vth. Thus, an interference pulse can draw the potential at the input connection downward as far as Vth, without the interference being visible at the output of the inverter.

A pull-down circuit is configured in an analogous manner; all that is necessary is to interchange the polarities of the voltages, and to use NMOS transistors instead of PMOS transistors.

There are innumerable further possibilities for producing a pull-up circuit or a pull-down circuit that operate as a function of the potential that is intended to draw them upward or downward.

Regardless of the details of the practical implementation, the described electrical circuits make it possible to vary the potential to which the node point is drawn by the electrical circuit by a weak signal, but not also just by electromagnetic interference.

I claim:

1. An electrical circuit assembly, comprising:
   a node supplying a potential; and
   an electrical circuit drawing the potential at said node weakly to a given potential when and for so long as said node is drawn to a different potential by an external signal, and drawing the potential at said node strongly to the given potential when and for so long as said node is not drawn to a different potential by an external signal;
   said electrical circuit having a first component connecting said node to said given potential to which said node is to be drawn by said electrical circuit;
   said electrical circuit having a second component connecting said node to said given potential to which said node is to be drawn by said electrical circuit;
   a switching element connected between said second component and said node;
     wherein said switching element is opened when the potential at said node is below a threshold value; and said switching element is closed when the potential at said node is above said threshold value or above a second threshold value; and
   a comparator having an output providing an output signal controlling said switching element, said comparator comparing the potential at said node with a threshold voltage.

2. The assembly according to claim 1, wherein said electrical circuit is a pull-up circuit drawing said node to a high-voltage level when and for as long as said node is not drawn in another way to a lower voltage level.

3. The assembly according to claim 1, wherein said electrical circuit is a pull-down circuit drawing said node to a low voltage level when and for as long as said node is not drawn in another way to a higher voltage level.

4. The assembly according to claim 1, wherein said electrical circuit is part of an integrated circuit, and said node is connected to an input connection of the integrated circuit.

5. The assembly according to claim 1, including a further electrical circuit connected to said node, said further electrical circuit operating dependent upon the potential at said node.

6. The assembly according to claim 1, wherein said first component is a resistor.

7. The assembly according to claim 1, wherein said first component is a current source.

8. The assembly according to claim 1, wherein said second component is a current source.

9. The assembly according to claim 1, wherein said first component has a control input and, by driving said component through said control input, said component selects how strongly said node is drawn to said given potential.

10. An electrical circuit assembly, comprising:
    a node supplying a potential; and
    an electrical circuit drawing the potential at said node weakly to a given potential when and for so long as said node is drawn to a different potential by an external signal, and drawing the potential at said node strongly to the given potential when and for so long as said node is not drawn to a different potential by an external signal; and
    a resistor connecting said node to said given potential to which said node is to be drawn by said electrical circuit.

11. An electrical circuit assembly, comprising:
    a node supplying a potential;
    an electrical circuit drawing said node, dependent upon the potential at said node, to a given potential when and for as long as said node is not drawn in any other way to a different potential, said electrical circuit having a component
    connecting said node to said given potential to which said node is to be drawn by said electrical circuit;
    said component having a control input and, by driving said component through said control input, said component selecting how strongly said node is drawn to said given potential; and
    a control device having an output providing an output signal, and said component being a transistor having:
      a drain connected to said node;
      a source receiving a voltage corresponding approximately to said given potential to which said node is to be brought; and
      a gate connected to said output of said control device; and
    a supply voltage having a first pole and a second pole, said supply voltage supplying power to said control device, and wherein:
    said control device includes:
      a second transistor having a source, and a drain;
      a third transistor having a source, a drain, and a gate; and
      a current source having a first pole and a second pole;
    said second transistor, said third transistor, and said current source are connected in series;
    said source of said second transistor is connected to said first pole of said supply voltage;
    said drain of said second transistor is connected to said source of said third transistor;

said gate of said second transistor is connected to said node;

said drain of said third transistor is connected to said first pole of said current source, to said gate of said third transistor, and to said gate of said transistor;

said gate of said third transistor is connected to said first pole of said current source, to said drain of said third transistor, and to said gate of said transistor and;

said first pole of said current source is connected to said gate of said transistor;

said second pole of said current source is connected to said second pole of said supply voltage.

12. An electrical circuit assembly, comprising:

a node supplying a potential; and an electrical circuit drawing said node, dependent upon the potential at said node, to a given potential when and for as long as said node is not drawn in any other way to a different potential, said electrical circuit having:

a first component connecting said node to said given potential to which said node is to be brought by said electrical circuit so that said given potential is always applied to said node by said first component;

a second component connecting said node to said given potential to which said node is to be brought by said electrical circuit; and a switching element connecting said second component to said node, said switching element having opening and closing positions being dependent on the potential at said node.

13. The assembly according to claim 12, including a comparator having an output providing an output signal controlling said switching element, said comparator comparing the potential at said node with a threshold voltage.

14. The assembly according to claim 12, wherein said first component is a resistor.

15. The assembly according to claim 12, wherein said second component is a resistor.

16. The assembly according to claim 12, wherein said first component is a current source.

17. The assembly according to claim 12, wherein said second component is a current source.

18. The assembly according to claim 12, wherein said first component has a control input and, by driving said component through said control input, said first component selects how strongly said node is drawn to said given potential.

19. An electrical circuit assembly, comprising:

a node supplying a potential;

an electrical circuit drawing said node, dependent upon the potential at said node, to a given potential when and for as long as said node is not drawn in any other way to a different potential, said electrical circuit having;

a control device having an output providing an output signal;

a supply voltage having a first pole and a second pole, said supply voltage supplying power to said control device;

a first transistor connecting said node to said given potential to which said node is to be drawn by said electrical circuit, said first transistor having:

a drain connected to said node;

a source receiving a voltage corresponding approximately to said given potential to which said node is to be brought; and a gate connected to said output of said control device; and said control device including:

a second transistor having a source, and a drain;

a third transistor having a source, a drain, and a gate; and a current source having a first pole and a second pole;

said second transistor, said third transistor, and said current source being connected in series;

said source of said second transistor being connected to said first pole of said supply voltage;

said drain of said second transistor being connected to said source of said third transistor;

said gate of said second transistor being connected to said node;

said drain of said third transistor being connected to said first pole of said current source, to said gate of said third transistor, and to said gate of said first transistor;

said gate of said third transistor being connected to said first pole of said current source, to said drain of said third transistor, and to said gate of said first transistor;

said first pole of said current source being connected to said gate of said first transistor; and said second pole of said current source being connected to said second pole of said supply voltage.

* * * * *